US009692382B2

(12) United States Patent
Isberg et al.

(10) Patent No.: US 9,692,382 B2
(45) Date of Patent: Jun. 27, 2017

(54) SMART AUTOMATIC AUDIO RECORDING LEVELER

(75) Inventors: Peter Isberg, Lund (SE); Björn Gröhn, Lund (SE)

(73) Assignee: Sony Corporation, Tokyo (JP)

( * ) Notice: Subject to any disclaimer, the term of this patent is extended or adjusted under 35 U.S.C. 154(b) by 318 days.

(21) Appl. No.: 14/359,611

(22) PCT Filed: Jan. 6, 2012

(86) PCT No.: PCT/IB2012/050090
§ 371 (c)(1),
(2), (4) Date: May 21, 2014

(87) PCT Pub. No.: WO2013/102799
PCT Pub. Date: Jul. 11, 2013

(65) Prior Publication Data
US 2014/0341396 A1 Nov. 20, 2014

(51) Int. Cl.
*H03G 3/32* (2006.01)
*H03G 7/00* (2006.01)
(Continued)

(52) U.S. Cl.
CPC .............. *H03G 3/32* (2013.01); *G11B 27/034* (2013.01); *G11B 27/105* (2013.01); *G11B 27/28* (2013.01); *G11B 27/322* (2013.01); *H03G 7/007* (2013.01)

(58) Field of Classification Search
CPC ........ H03G 3/32; H03G 7/007; G11B 27/034; G11B 27/105; G11B 27/28; G11B 27/322
(Continued)

(56) References Cited

U.S. PATENT DOCUMENTS 3,789,143 A * 1/1974 Blackmer ............ H03G 1/0005
333/14
5,101,310 A * 3/1992 Brown ................... G11B 20/02
360/68
(Continued)

FOREIGN PATENT DOCUMENTS

CN       101790843 A    7/2010
CN       102007777 A    4/2011
(Continued)

OTHER PUBLICATIONS

Chinese State Intellectual Property Office; First Office Action; Oct. 9, 2015; issued in Chinese Patent Application No. 201280066032.0.
(Continued)

*Primary Examiner* — Davetta W Goins
*Assistant Examiner* — Daniel Sellers
(74) *Attorney, Agent, or Firm* — James C. Edwards; Moore & Van Allen, PLLC

(57) ABSTRACT

The invention is directed to systems, methods and computer program products for adjusting audio properties after recording an audio. An exemplary method includes recording audio using an audio capturing system, wherein the recorded audio is associated with an audio level; determining one or more audio signal properties associated with the recorded audio; comparing the audio level with a first predetermined threshold level; and in response to determining the audio level is greater than a first predetermined threshold level, adjusting the recorded audio based at least partially on modifying the one or more determined audio signal properties, wherein the adjusting step is performed a finite time interval following the recording step.

16 Claims, 4 Drawing Sheets

(51) Int. Cl.
*G11B 27/034* (2006.01)
*G11B 27/10* (2006.01)
*G11B 27/28* (2006.01)
*G11B 27/32* (2006.01)

(58) Field of Classification Search
USPC ........................................................ 381/107
See application file for complete search history.

(56) References Cited

U.S. PATENT DOCUMENTS

| | | | |
|---|---|---|---|
| 6,959,220 B1* | 10/2005 | Wiser | G11B 20/10527 |
| | | | 381/103 |
| 2003/0028273 A1* | 2/2003 | Lydecker | G10H 1/0091 |
| | | | 700/94 |
| 2006/0002572 A1* | 1/2006 | Smithers | H03G 9/005 |
| | | | 381/104 |
| 2010/0254546 A1 | 10/2010 | Hosomi | |
| 2011/0085677 A1* | 4/2011 | Walsh | H03G 9/005 |
| | | | 381/94.3 |
| 2011/0129091 A1 | 6/2011 | Kron | |

FOREIGN PATENT DOCUMENTS

| | | |
|---|---|---|
| EP | 1387352 A2 | 2/2004 |
| GB | 2429346 A | 2/2007 |
| WO | 02097977 A2 | 12/2002 |
| WO | 2009125326 A1 | 10/2009 |

OTHER PUBLICATIONS

Levine, Scott Nathan, "Audio Representations for Data Compression and Compressed Domain Processing", Dec. 31, 1998, XP55038388, Retrieved from the Internet: URL:https://ccrma.stanford.edu/~scottl/thesis/thesis.pdf [retrieved on Sep. 17, 2012] p. 19-p. 21.
International Search Report and Written Opinion; Sep. 27, 2012; issued in International Patent Application No. PCT/IB2012/050090.
International Preliminary Report on Patentability; Jul. 17, 2014; issued in International Patent Application No. PCT/IB2012/050090.
Levine, Nathan Scott; "Audio Representations for Data Compression and Compressed Domain Processing", Dec. 31, 1998, XP55038388, [retreived on Sep. 17, 2012].
Communication Pursuant to Article 94(3) EPC; Mar. 29, 2016; issued in European Patent Application No. 12701173.2.
State Intellectual Property Office, P.R. China; Second Office Action; Jun. 23, 2016; issued in Chinese Patent Application No. 201280066032.0.

* cited by examiner

SMART AUTOMATIC AUDIO RECORDING LEVELER

BACKGROUND

Audio can be recorded in locations where each audio source produces audio associated with different audio properties. An example of an audio property is the audio level. Additionally, each audio source's audio properties may change during the recording period. The audio may either be a stand-alone audio recording or audio associated with a video recording. A listener who listens to an audio in which each audio source produces audio associated with different audio properties or an audio in which a particular audio source's audio changes during the recording period may have an uncomfortable listening experience. For example, during the recording period, one audio source may produce audio associated with a greater audio level compared to another audio source. As a further example, during the recording period, an audio source's audio may vary in audio level. Therefore, what is needed is a processing system that adjusts the audio properties so that a listener of the audio has a better listening experience.

BRIEF SUMMARY

Embodiments of the invention are directed to systems, methods and computer program products for adjusting audio properties after recording an audio. An exemplary method includes recording audio using an audio capturing system, wherein the recorded audio is associated with an audio level; determining one or more audio signal properties associated with the recorded audio; comparing the audio level with a first predetermined threshold level; and in response to determining the audio level is greater than the first predetermined threshold level, adjusting the recorded audio based at least partially on modifying the one or more determined audio signal properties, wherein the adjusting step is performed a finite time interval following the recording step.

In some embodiments, the adjusting step comprises applying a gain factor or a scaling factor to the recorded audio such that that the audio level associated with the recorded audio is reduced.

In some embodiments, the determining step is executed simultaneously with the recording step. In other embodiments, the determining step is executed after the recording step.

In some embodiments, the method further comprises encoding the recorded audio.

In some embodiments, the adjusting comprises adjusting the encoded audio based at least partially on applying a scaling factor to the encoded audio. In some embodiments, the scaling factor is stored as metadata in a file that comprises the encoded audio.

In some embodiments, the method further comprises decoding the encoded audio; and the adjusting step comprises: adjusting the decoded audio based at least partially on applying a gain factor to the decoded audio.

In some embodiments, the adjusting step is performed either by the audio recording system or by a separate computing system.

In some embodiments, the adjusting step is performed either immediately prior to playback of the recorded audio or is performed in real-time during playback of the recorded audio.

In some embodiments, the method further comprises accessing a database comprising one or more sets of audio signal properties; selecting, from the database, a set of audio signal properties; determining either a gain factor or a scaling factor based at least partially on the selected set of audio signal properties; and adjusting the recorded audio based at least partially on the determined gain factor or scaling factor, wherein the adjusting step is performed either immediately prior to playback of the recorded audio or is performed in real-time during playback of the recorded audio.

In some embodiments, the method further comprises comparing the audio level with a second predetermined threshold level; and in response to determining the audio level is smaller than the second predetermined threshold level, adjusting the recorded audio based at least partially on modifying the one or more determined audio signal properties, wherein the adjusting step comprises applying a gain factor or a scaling factor to the recorded audio such that that the audio level associated with the recorded audio is increased.

In some embodiments, the signal properties comprise at least one of a root mean square level, a peak level, an average level, and a peak-to-peak level.

In some embodiments, the adjusting step reduces a dynamic range associated with the recorded audio.

In some embodiments, the adjusting step reduces audible artifacts in the recorded audio.

In some embodiments, the method further comprises comparing the audio level with a third predetermined threshold level; and in response to determining the audio level is smaller than the third predetermined threshold level, adjusting the recorded audio based at least partially on modifying the one or more determined audio signal properties, wherein the adjusting step comprises applying a gain factor or a scaling factor to the recorded audio such that that the audio level associated with the recorded audio is decreased.

In some embodiments, the method further comprises comparing the audio level with a fourth predetermined threshold level; and in response to determining the audio level is greater than the fourth predetermined threshold level, adjusting the recorded audio based at least partially on modifying the one or more determined audio signal properties, wherein the adjusting step comprises applying a gain factor or a scaling factor to the recorded audio such that that the audio level associated with the recorded audio is increased.

In some embodiments, the adjusting step comprises applying one or more gain factors or scaling factors to the recorded audio such that a separate gain factor or scaling factor is applied either to each sub-period of the recorded audio or to audio associated with each audio source in the recorded audio.

In some embodiments, the adjusted audio is stored separately from the recorded audio.

In some embodiments, a system for adjusting audio is also provided. The exemplary system comprises an audio capturing system configured to: record audio, wherein the recorded audio is associated with an audio level; determine one or more audio signal properties associated with the recorded audio; compare the audio level with a first predetermined threshold level; and in response to determining the audio level is greater than a first predetermined threshold level, adjust the recorded audio based at least partially on modifying the one or more determined audio signal properties, wherein the adjusting step is performed a finite time interval following the recording step.

In some embodiments, a computer program product for adjusting audio is also provided. The exemplary computer program product comprises a non-transitory computer readable medium comprising code configured to cause a computer to: record audio, wherein the recorded audio is associated with an audio level; determine one or more audio signal properties associated with the recorded audio; compare the audio level with a first predetermined threshold level; and in response to determining the audio level is greater than a first predetermined threshold level, adjust the recorded audio based at least partially on modifying the one or more determined audio signal properties, wherein the adjusting step is performed a finite time interval following the recording step.

BRIEF DESCRIPTION OF THE DRAWINGS

Figure 1:
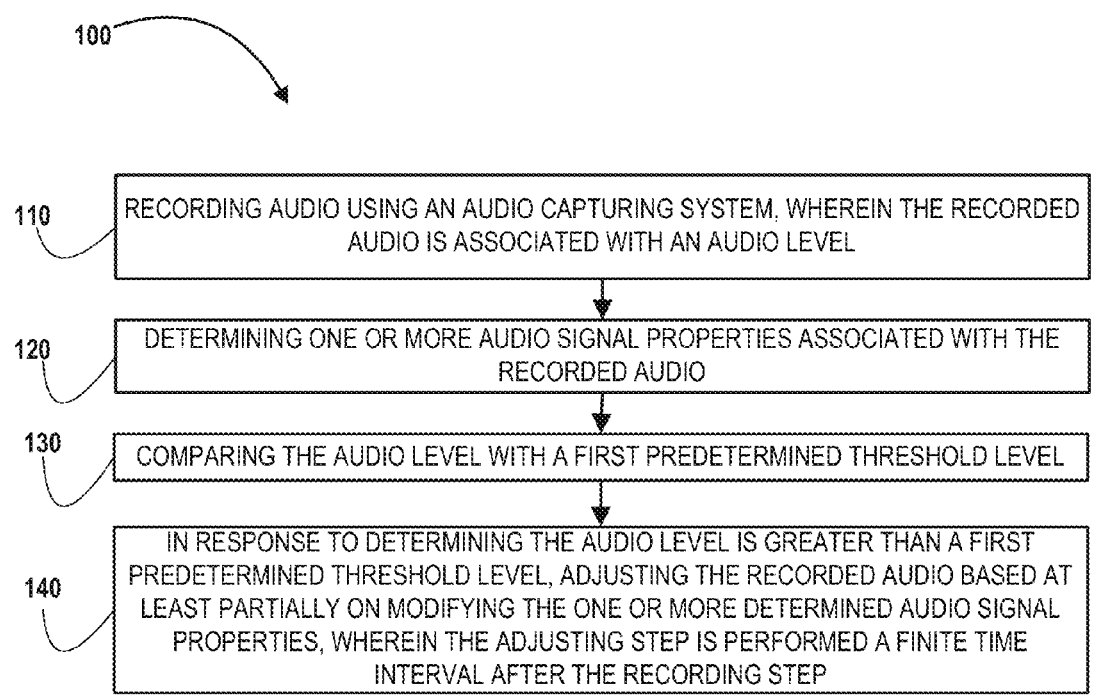
Figure 2:
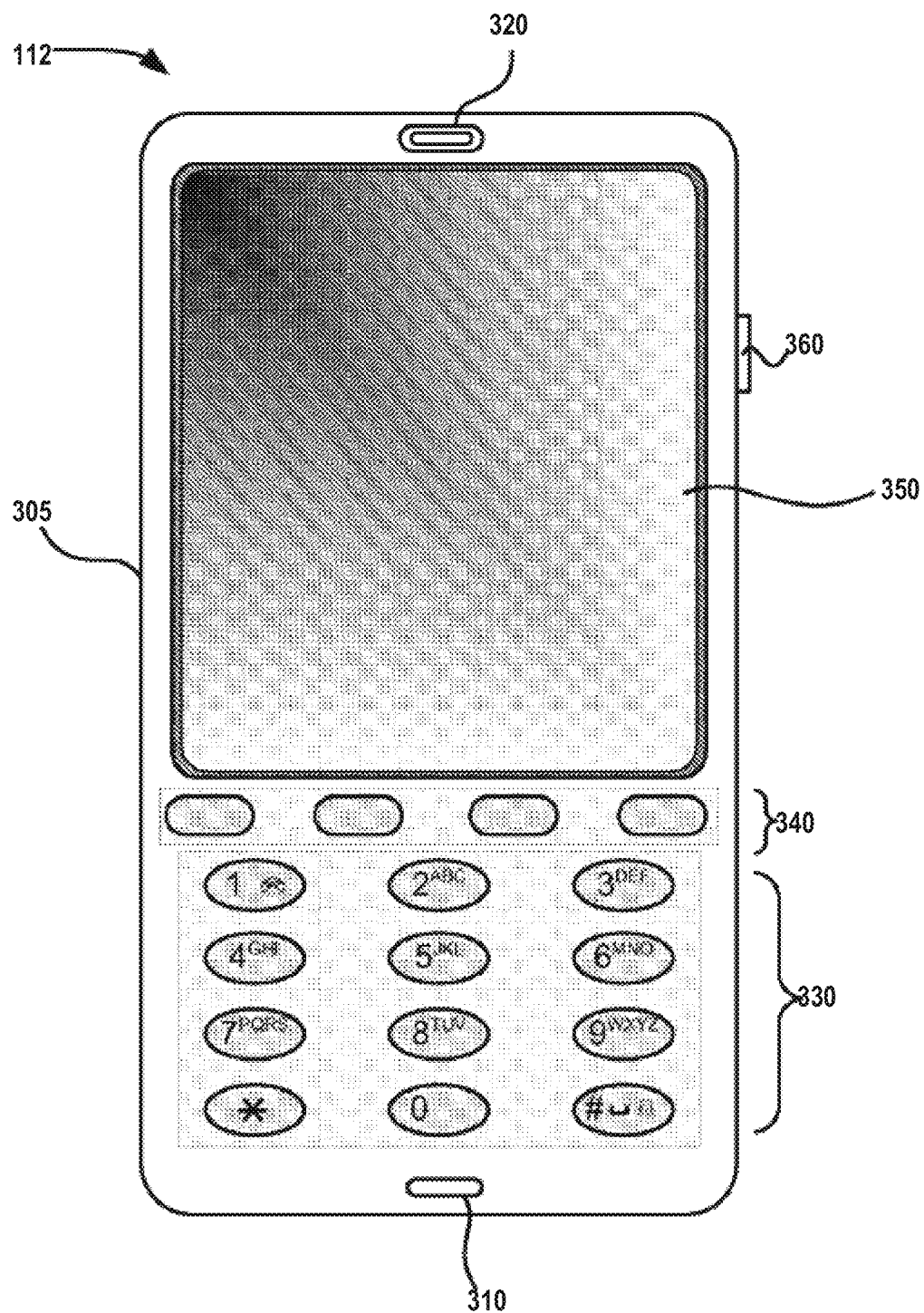
Figure 3:
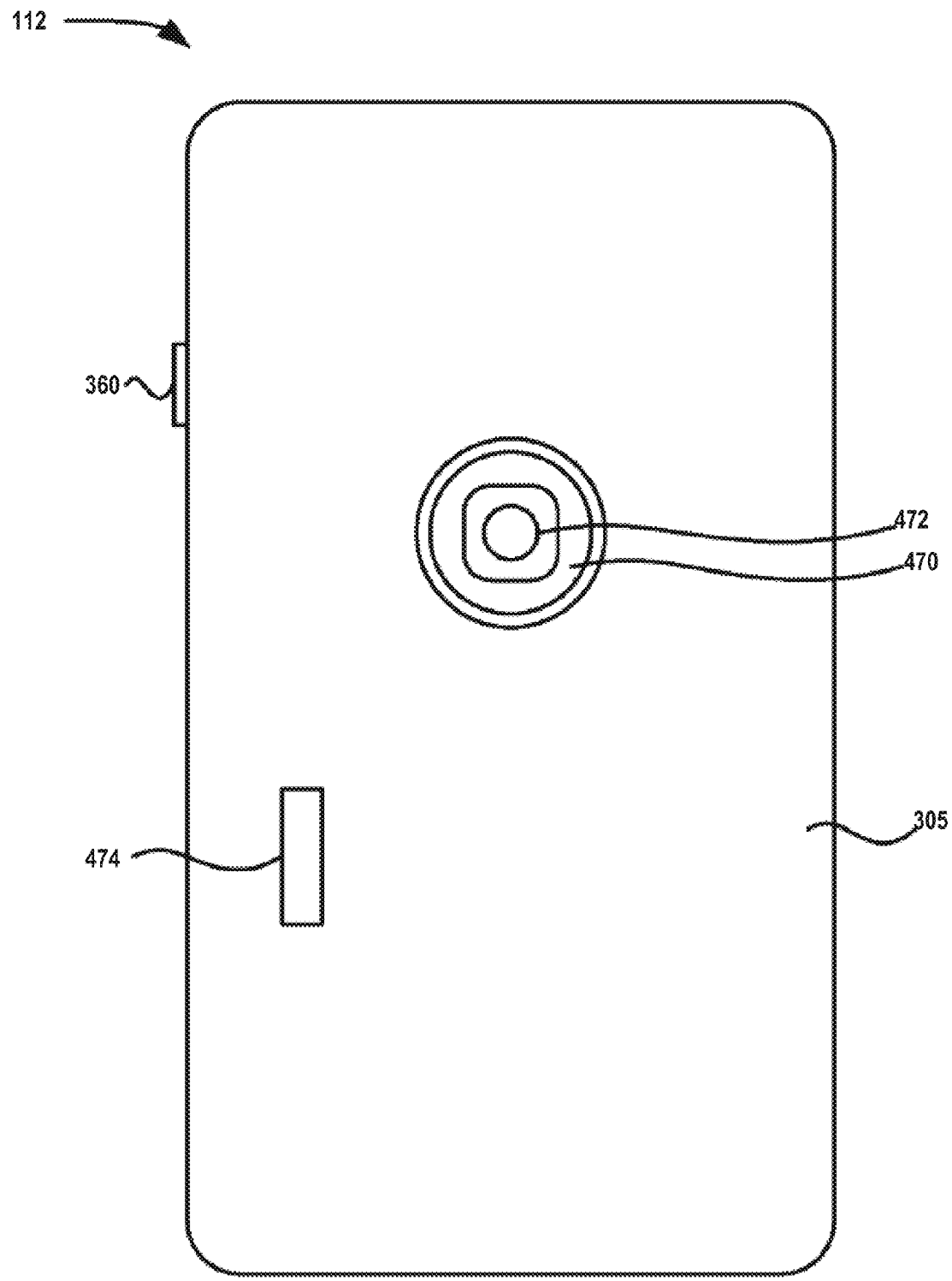
Figure 4:
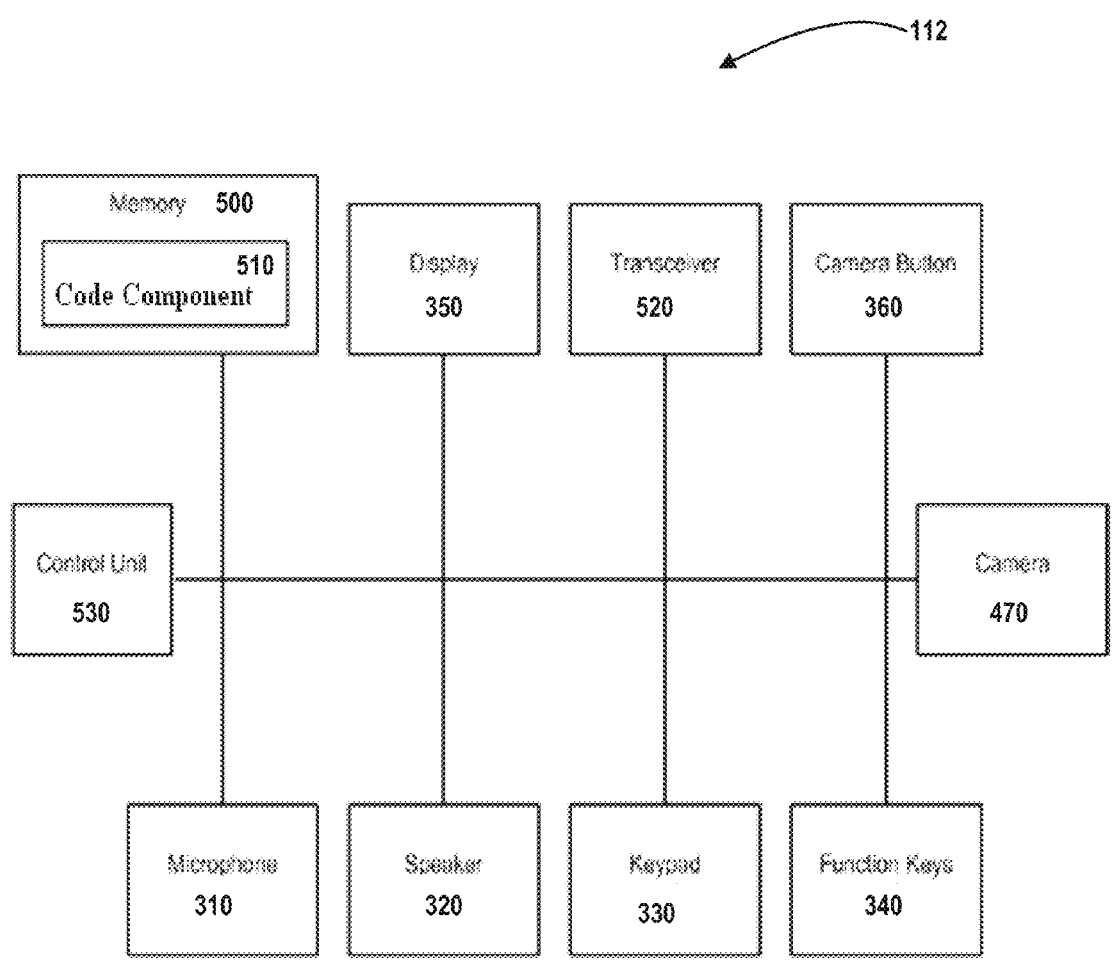

Having thus described embodiments of the invention in general terms, reference will now be made to the accompanying drawings, where:

FIG. 1 is an exemplary process flow for adjusting an audio, in accordance with embodiments of the present invention;

FIG. 2 is an exemplary device for recording an audio and/or adjusting the recorded audio, in accordance with embodiments of the present invention;

FIG. 3 is a diagram illustrating a rear view of exemplary external components of the device for recording an audio and/or adjusting the recorded audio depicted in FIG. 2, in accordance with embodiments of the present invention; and FIG. 4 is a diagram illustrating exemplary internal components of the device for recording an audio and/or adjusting the recorded audio depicted in FIG. 2, in accordance with embodiments of the present invention.

DETAILED DESCRIPTION OF EMBODIMENTS OF THE INVENTION

Embodiments of the present invention now may be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure may satisfy applicable legal requirements. Like numbers refer to like elements throughout.

As used herein, audio properties refer to one or more properties associated with audio output by an audio source. Audio properties may also be referred to as sound properties. These properties may include a root mean square (RMS) level, a peak level or amplitude (either positive peak or negative peak), a peak-to-peak value (difference between positive peak and negative peak), average value, frequency, wavelength, wavenumber, phase, etc. The signal properties are not limited to the signal properties described herein. Other audio or sound properties may include sound pressure, sound intensity, speed of sound, direction of sound, orientation of sound, etc.

Real-time dynamic processing of audio properties is the processing of audio properties in real-time while an audio is being recorded. There are disadvantages associated with real-time dynamic processing of audio properties. For example, real-time processing may create audible artifacts in the recorded audio. As used herein, audible artifacts refer to sounds or sound effects (e.g., pumping) not present in the original recording of the audio. Sometimes, the transition from real-time processing of a soft section (e.g., associated with a low or medium audio level) of an audio to a loud section (e.g., associated with a high audio level) of the audio may sound unnatural when the processed audio is played back. This is because the real-time transition causes the gain of the audio to suddenly increase. Similarly, the transition from real-time processing of a loud section (e.g., associated with a high audio level) of an audio to a soft section (e.g., associated with a low or medium audio level) of the audio may sound unnatural when the processed audio is played back. This is because the real-time transition causes the gain of the audio to suddenly decrease. These audible artifacts are undesirable and the systems, methods, and computer program products of the present invention are directed to reducing or eliminating these undesirable audible artifacts.

Real-time processing can create audible artifacts (e.g., pumping) because one or more audio properties (e.g., audio or volume level) may change during the recording period. An example of real-time dynamic processing is dynamic range compression. Dynamic range compression includes both downward compression and upward compression. Downward compression reduces sound level of loud sounds that are greater than a certain threshold level. Upward compression increases the sound level of sounds that are below a certain threshold level. Both upward and downward compression reduce a dynamic range of an audio signal. Another example of dynamic processing is dynamic expansion. Dynamic expansion expands a dynamic range of an audio signal. Downward expansion reduces the sound level of sounds that are below a certain threshold level (makes quiet sounds even quieter). Upward expansion increases the sound level of sounds that are greater than a certain threshold level (makes louder sounds even louder). Pumping or the introduction of audible artifacts occurs when the dynamic compression or dynamic expansion of an audio signal becomes audible. As used herein, the dynamic range refers to the difference between the loudest and quietest audio level associated with a system or and/or associated with a particular audio file that is recorded or played by the system. As used herein, an audio level may also be referred to as a sound level or a volume level.

Embodiments of the invention are directed to boosting a recorded audio clip. In some embodiments, the boosting process may be executed either by the device that records the audio or by a separate post-processing device. In some embodiments, the recorded audio comprises medium and low level (e.g., soft) audio signals and does not comprise high level (e.g., loud) audio signals. In such embodiments, a gain factor (or a scaling factor) is applied to both the medium and low level audio signals. In some embodiments, the recorded audio also comprises high level audio signals. In such embodiments, a device as described herein may be configured to apply a gain factor (or a scaling factor) to the medium and low level audio signals, but not apply a gain factor (or a scaling factor) to the high level audio signals. In such embodiments, a device as described herein may be configured to determine and distinguish between low level, medium level, and high level audio signals so that each type of audio signals may be separately configured or adjusted. In some embodiments of the invention, a recording device as described herein records (and/or encodes) audio in a file format that supports a single gain factor (or scaling factor) such that the single gain factor (or scaling factor) is applied to medium and low level audio signals and is not applied to high level audio level signals. As used herein, the various audio signals described herein may be audio signals associated with either recorded audio or video. Embodiments of the invention are directed to systems, methods and computer program products for automatically adjusting audio properties a finite time interval after recording an audio. In some embodiments of the invention, one or more signal properties are determined or collected during the recording of the audio. For example, these signal properties may include the RMS level, the peak level, or any of the other signal properties listed herein or not listed herein. In some embodiments of the invention, adjustment of these properties is made a finite time interval after the recording of the audio.

In other embodiments, these signal properties are not determined or collected during the recording of the audio. Instead, these signal properties are determined after the recording of the audio. Therefore, a system as described herein may access the recorded audio and determine signal properties (e.g., RMS level, peak level, etc.) for the recorded audio. Once the signal properties are determined, the system can modify these properties.

As used herein, a system or a device that performs the audio recording can be any type of computing or non-computing device. Examples of audio recording systems include, but are not limited to, mobile computing devices (e.g., mobile phones), image-capturing devices (e.g., cameras), gaming devices, laptop computers, portable media players, tablet computers, e-readers, scanners, other portable or non-portable computing or non-computing devices, as well as, in some embodiments, one or more components thereof and/or one or more peripheral devices associated therewith. The system or device that records the audio may be the same or different from the system or device on which the audio signal properties are adjusted.

As used herein, a system or a device that performs the adjustment of audio signal properties of the recorded audio can be any type of computing or non-computing device. Examples of audio adjustment systems include, but are not limited to, mobile computing devices (e.g., mobile phones), image-capturing devices (e.g., cameras), gaming devices, laptop computers, portable media players, tablet computers, e-readers, scanners, other portable or non-portable computing or non-computing devices, as well as, in some embodiments, one or more components thereof and/or one or more peripheral devices associated therewith.

Embodiments of the invention are not limited to any particular time interval between the recording of the audio and the adjusting of the audio properties. In some embodiments, the adjustment process may begin only after an entire audio file has been recorded (i.e., audio has been written to a temporary or permanent part of the memory or storage drive). In other embodiments, the adjustment process may begin even before an entire audio file has been recorded. In such embodiments, a system as described herein adjusts audio signal properties associated with audio that has already been recorded. Therefore, while audio is being written to a file, a system as described herein adjusts audio signal properties associated with audio that already has been written to the file. Therefore, for example, a system described herein adjusts signal properties associated with audio that was recorded a finite time interval (e.g., a few seconds or even smaller time units such as on the order of milliseconds, microseconds, nanoseconds, picoseconds, or the like) prior to audio that is currently being recorded to the audio file. In some embodiments, the adjusted audio overwrites the previously unadjusted audio. In such embodiments, after a finite time interval following completion the recording of the audio, the audio file comprises only adjusted audio. In other embodiments, the adjusted audio is saved to a different file such that after the completing the recording of the audio, there are two audio files that are available on the system that records the audio: an unadjusted original audio file and an adjusted audio file.

Embodiments of the invention provide several different ways to adjust audio properties associated with a recorded audio. In some embodiments, a system as described herein records an audio file. In some embodiments, the recorded audio file is a raw audio file. A codec associated with the system may encode the raw audio file. According to embodiments described herein, encoding refers to processing the raw audio file data (which may either be analog audio data or digital audio data) based on an audio file format or streaming media file format such that the processed audio file data may be played back by software that can play the selected audio file format or streaming media file format. In some embodiments, the system may automatically determine the file format for encoding the raw audio file data. In other embodiments, at the time of encoding, the system may prompt a user of the system, via a user interface of the system, to specify a file format. In still other embodiments, prior to the time of encoding, the system may allow a user to store the user's preference of one or more audio file formats, and at the time of encoding, the system may automatically encode the audio file based at least partially on the user's stored preference. In some embodiments, the encoded audio file may be stored as a separate audio file from the original raw audio file. A codec as described herein may be a hardware module, a software module, or a module that includes both hardware and software components.

After the audio file is recorded and encoded, either the same system or a different system as described herein decodes the encoded audio file. A codec associated with the system may decode the encoded audio file. The codec used for the decoding step may either be the same codec that was used for encoding for the audio file or may be different from the codec that was used to encode the raw audio file. According to embodiments described herein, decoding refers to the process of decoding the encoded audio file data (which may either be analog audio data or digital audio data) according to an audio file format or streaming media file format. In some embodiments, the system may automatically determine the file format for decoding the raw audio file data. In other embodiments, at the time of decoding, the system may prompt a user of the system, via a user interface of the system, to specify a file format. In still other embodiments, prior to the time of decoding, the system may allow a user to store the user's preference of one or more audio file formats, and at the time of decoding, the system may automatically decode the encoded audio file based at least partially on the user's stored preference. In some embodiments, the decoded audio file data may mirror the original raw audio file data, while in other embodiments, the decoded audio file data may be different (either slightly different or heavily different) from the original raw audio file data. In some embodiments, the decoded audio file can be stored as a separate file from the original raw audio file or the encoded audio file.

The system then applies a gain (or a gain factor) to the decoded file. In some embodiments, applying the gain to the decoded file changes one or more signal properties of the audio signals stored in the decoded file (e.g., RMS level, peak level, etc.). In some embodiments, applying a gain changes the dynamic range of the audio file.

In some embodiments, applying a gain reduces the dynamic range of the audio file (compression). In such embodiments, applying a gain greater than one increases the levels (e.g., RMS level, peak level, etc.) of sounds that are smaller than a first threshold level (upward compression).

Additionally, in such embodiments, applying a gain smaller than one reduces the levels of sounds that are greater than a second threshold level (downward compression). In some embodiments, the first threshold level may be equal to the second threshold level, whereas in other embodiments, the first threshold level is different from the second threshold level.

In some embodiments, applying a gain increases the dynamic range of the audio file (expansion). In such embodiments, applying a gain smaller than one reduces the levels of sounds that are smaller than a third threshold level (downward expansion). Additionally, in such embodiments, applying a gain greater than one increases the levels of sounds above a fourth threshold level (upward expansion). In some embodiments, the third threshold level may be equal to the fourth threshold level, whereas in other embodiments, the third threshold level is different from the fourth threshold level.

In some embodiments, a user may pre-define one or more gain factors to be applied depending on the situation (e.g., downward compression, upward compression, downward expansion, upward expansion, etc.), whereas in other embodiments, the system may automatically define the one or more gain factors to be applied depending on the situation. Additionally, in some embodiments, a user may pre-define the various threshold levels described herein, or in other embodiments, the system may automatically determine the various threshold levels described herein.

In some embodiments, the value of this gain is based at least partially on the previously determined or collected signal properties associated with the recorded audio. In some embodiments, the value of this gain may additionally be based at least partially on the type of decoding that was used to decode the encoded audio file, and/or the type of encoding that was used to encode the raw audio file. In some embodiments, the value of the gain may have been pre-selected by a user of the system. In some embodiments, the value of the gain is based at least partially on the desired output audio level either specified by the user or determined automatically by the system. As described previously, an audio file may comprise audio output by multiple audio sources. In some embodiments, a single gain factor is applied to the entire audio file such that each audio source's audio level (e.g., volume level) is modified based on the single gain factor. In some embodiments, this single applied gain factor causes audio output by each audio source to be within a predetermined range of audio levels. In some embodiments, this single applied gain factor causes audio output by each audio source to be approximately at a similar audio level. In other embodiments, a plurality of varying gain factors are applied to the audio file. In such embodiments, a system may be able to determine distinct audio sources (based on analyzing change in signal characteristics of the audio signals), and may be able to apply separate gain factors to each audio source's audio level. By applying separate gain factors to each audio source's audio level, the system may bring the audio level associated with each audio source into a predetermined audio level range. Alternatively, by applying separate gain factors to each audio source's audio level, the system substantially harmonizes or equalizes the audio levels associated with each audio source such that the audio output by each audio source is approximately at a similar audio level.

In some embodiments, a single audio source's audio level may vary during the recording period. In these embodiments, the system may be able to analyze the recorded audio and determine one or more sub-periods, during the recording period, wherein each sub-period comprises audio that is of an approximately single audio level (or is within a predetermined narrow range of audio levels) and is associated with a single audio source (or may be associated with multiple audio sources). In such embodiments, the system may apply a separate gain factor to each sub-period. By applying separate gain factors to each sub-period, the system may bring the audio level associated with each sub-period into a predetermined audio level range. Alternatively, by applying separate gain factors to each sub-period, the system substantially harmonizes or equalizes the audio levels associated with each sub-period such that the audio output during each sub-period is approximately at a similar audio level when compared to another sub-period.

The process of applying one or more gain factors to the decoded audio file reduces or eliminates possible audible artifacts that may be introduced when dynamic processing (e.g., leveling) is used. In some embodiments, the decoded audio file with the new gain factor may be stored as a different file that is separate from the decoded audio file with the old gain factor.

Subsequently, following the step of applying a gain to the decoded audio file, the system encodes the file again. A codec as described herein may be used to encode the file again. In some embodiments, the system may automatically determine the file format for encoding the raw audio file data. In some embodiments, this file format may be the same file format that was previously used for encoding the raw audio file, while in other embodiments, the file format may be different from the previous file format that was used for encoding the audio file. In other embodiments, at the time of encoding, the system may prompt a user of the system, via a user interface of the system, to specify a file format. In still other embodiments, prior to the time of encoding, the system may allow a user to store the user's preference of one or more audio file formats, and at the time of encoding, the system may automatically encode the audio file based at least partially on the user's stored preference.

In some embodiments, after an audio file is recorded and encoded as described previously, a codec associated with the system (either the adjusting system or the recording system) does not decode the encoded file. As described previously, an encoded audio file may be a processed audio file. This processed audio file is associated with a scaling factor. In some embodiments, the system either modifies this scaling factor or applies a scaling factor directly to the encoded file. In some embodiments, modifying this scaling factor or applying a new scaling factor to the encoded file changes one or more signal properties of the audio signals stored in the encoded file (e.g., RMS level, peak level, etc.). In some embodiments, modifying the scaling factor or applying a new scaling factor changes the dynamic range of the audio file.

In some embodiments, modifying the scaling factor or applying a new scaling factor reduces the dynamic range of the audio file (compression). In such embodiments, applying a scaling factor greater than one increases the levels (e.g., RMS level, peak level, etc.) of sounds that are smaller than a first threshold level (upward compression). Additionally, in such embodiments, applying a scaling factor smaller than one reduces the levels of sounds that are greater than a second threshold level (downward compression). In some embodiments, the first threshold level may be equal to the second threshold level, whereas in other embodiments, the first threshold level is different from the second threshold level.

In some embodiments, applying a scaling factor increases the dynamic range of the audio file (expansion). In such embodiments, applying a scaling factor smaller than one reduces the levels of sounds that are smaller than a third threshold level (downward expansion). Additionally, in such embodiments, applying a scaling factor greater than one increases the levels of sounds above a fourth threshold level (upward expansion). In some embodiments, the third threshold level may be equal to the fourth threshold level, whereas in other embodiments, the third threshold level is different from the fourth threshold level.

In some embodiments, a user may pre-define one or more scaling factors to be applied depending on the situation (e.g., downward compression, upward compression, downward expansion, upward expansion, etc.), whereas in other embodiments, the system may automatically define the one or more scaling factors to be applied depending on the situation. Additionally, in some embodiments, a user may pre-define the various threshold levels described herein, or in other embodiments, the system may automatically determine the various threshold levels described herein.

In some embodiments, the system determines a new scaling factor or modifies the value of this scaling factor is based at least partially on the previously determined or collected signal properties associated with the recorded audio. In other embodiments, the value of this scaling factor may also be modified at least partially on the type of encoding applied to the raw audio file. In some embodiments, the new scaling factor or the amount of modification to be applied to the encoded audio file's scaling factor may have been pre-selected by a user of the system. In some embodiments, the value of the scaling factor to be applied is based at least partially on the desired output audio level either specified by the user or determined automatically by the system. As described previously, an audio file may comprise audio output by multiple audio sources. In some embodiments, the scaling factor applied to the entire encoded audio file is modified such that each audio source's audio level (e.g., volume level) is modified based on the modified scaling factor. In some embodiments, this single applied modified scaling factor causes audio output by each audio source to be within a predetermined range of audio levels. In some embodiments, this single applied modified scaling factor causes audio output by each audio source to be approximately at a similar audio level. In other embodiments, the scaling factor applied to the audio file is modified such that a plurality of varying scaling factors are applied to the audio file. In such embodiments, a system may be able to determine distinct audio sources (based on analyzing change in signal characteristics of the audio signals), and may be able to apply separate scaling factors to each audio source's audio level. By applying separate gain factors to each audio source's audio level, the system may bring the audio level associated with each audio source into a predetermined audio level range. Alternatively, by applying separate scaling factors to each audio source's audio level, the system substantially harmonizes or equalizes the audio levels associated with each audio source such that the audio output by each audio source is approximately at a similar audio level.

In some embodiments, a single audio source's audio level may vary during the recording period. In these embodiments, the system may be able to analyze the recorded audio and determine one or more sub-periods, during the recording period, wherein each sub-period comprises audio that is of an approximately single audio level (or is within a predetermined narrow range of audio levels) and is associated with a single audio source (or may be associated with multiple audio sources). In such embodiments, the system may apply a separate scaling factor to each sub-period. By applying separate gain factors to each sub-period, the system may bring the audio level associated with each sub-period into a predetermined audio level range. Alternatively, by applying separate scaling factors to each sub-period, the system substantially harmonizes or equalizes the audio levels associated with each sub-period such that the audio output during each sub-period is approximately at a similar audio level when compared to another sub-period.

Therefore, in some embodiments, when a decoder associated with the system is used to decode (or play back) the encoded audio file with the modified scaling factor, the decoder plays back the audio file where the audio output by each audio source is within a predetermined range of audio levels. The process of modifying the scaling factor of the encoded audio file after the recording and encoding of the audio file reduces or eliminates possible audible artifacts that may be introduced when dynamic processing (e.g., leveling) is used. In some embodiments, the encoded audio file with the modified or new scaling factor may be stored as a separate file from the original encoded audio file.

In some embodiments, a database of signal properties is stored within the system that records the audio. The database may comprise multiple sets of signal properties. The signal properties may include values associated with the various signal properties of an audio signal described herein. For example, a set of signal properties includes a root mean square (RMS) level, a peak level or amplitude (either positive peak or negative peak), a peak-to-peak value (difference between positive peak and negative peak), average value, frequency, wavelength, wavenumber, etc. Other values that may be stored in a particular set of signal properties associated with the audio signal are sound pressure, sound intensity, speed of sound, direction of sound, orientation of sound, etc. In some embodiments, the database also stores a desired gain and/or a desired scaling factor associated with an audio signal. These values may be stored in each set of signal properties in the database or may be stored separately from the sets of signal properties in the database. In other embodiments, the system does not store a desired gain and/or a desired scaling factor in the database. Instead, the system calculates a gain and/or a scaling factor based on a selected set of signal properties accessed from the database.

Each set of signal properties in the database may be directed to a particular type of desired playback of an audio file. In some embodiments, a user of the system may pre-configure each of the multiple sets of signal properties, and may specify one or more conditions for a choosing a particular set of signal properties. When the recorded audio file (which may either be the recorded raw audio file or the encoded audio file) is about to be played back by the system (either the system that recorded the audio file or a different system), the system may automatically choose a particular set of signal properties such that the audio file that is being played back is configured based at least partially on the chosen set of signal properties. Therefore, in this embodiment, the audio file is not automatically processed after the recording of the audio file; instead, the audio file is either configured based on the chosen signal properties in real-time during playback, or is configured based on the chosen signal properties immediately prior to playback. In some embodiments, "configuring the audio file" refers to the process of determining a gain factor (and/or a scaling factor) based on the chosen set of signal properties, and applying the gain factor to the audio file. In some embodiments, a single gain factor is applied to the entire audio file such that each audio source's audio level (e.g., volume level) is modified based on the single gain factor. In some embodiments, this single applied gain factor causes audio output by each audio source to be within a predetermined range of audio levels. In some embodiments, this single applied gain factor causes audio output by each audio source to be approximately at a similar audio level. In other embodiments, a plurality of varying gain factors are applied to the audio file. In such embodiments, a system may be able to determine distinct audio sources (based on analyzing change in signal characteristics of the audio signals), and may be able to apply separate gain factors to each audio source's audio level (where each of the separate gain factors is calculated based on the chosen set of signal properties). By applying separate gain factors to each sub-period, the system may bring the audio level associated with each sub-period into a predetermined audio level range. Alternatively, by applying separate gain factors to each audio source's audio level, the system substantially harmonizes or equalizes the audio levels associated with each audio source such that the audio output by each audio source is approximately at a similar audio level. The process of applying one or more gain factors to the decoded audio file reduces or eliminates possible audible artifacts that may be introduced when dynamic processing (e.g., leveling) at the time of recording the audio is used.

The system may automatically choose a particular set of signal properties based on one or more preconfigured user preferences regarding the type of desired playback (fast playback, slow playback, etc.) or an environment (e.g., quiet environment, crowded environment, etc.) associated with the playback. In some embodiments, the system may automatically choose a particular set of signal properties that causes optimal reduction of audible artifacts during playback. In other embodiments, when the recorded audio file is about to be played back by the system, the system may prompt a user to select a particular set of signal properties to apply to the audio file being played back by the system. Therefore, the system configures the recorded audio based on the chosen set of signal properties, where the set of signal properties has either been automatically chosen by the system or has been chosen by the user of the system, and plays back the configured recorded audio. In some embodiments, the process of configuring the recoded audio does not affect properties of the original recorded file. In other embodiments, the process of configuring the recorded audio changes the properties of the original recorded audio file such that the original recorded audio file now comprises configured audio.

In some embodiments, when a user selects a recorded audio file to be played back by the system, the user's selection automatically triggers the access of the database of signal property sets such that when the audio is played back, the played back audio is configured based on a chosen set of signal properties. The process of playing back a recorded audio file based on a chosen set of signal properties reduces or eliminates artifacts that might be audible if the recorded audio file is played back without selecting a chosen set of signal properties or if the recorded audio file is dynamically processed during the recording of the audio.

In some embodiments, the database described herein is stored separately from the recorded audio file. In such embodiments, when the user transmits the recorded audio file to a different system, the user needs to also transmit the database to that different system if the user wishes to play back the recorded audio file such that the audio file is played back based at least partially on the chosen set of signal properties selected from the database.

In other embodiments, the database is stored with the recorded audio file. In some embodiments, the database is stored in the recorded audio file such that when the recorded audio file is transmitted to a different system, the database is also transmitted to that different system. In other embodiments, the database is stored separately from the recorded audio file but closely associated to the recorded audio file such that when the recorded audio file is transmitted to a different system, the database is also automatically transmitted to that different system.

In some embodiments, the processing of the audio (based on the database described herein) that occurs in the system that captures the audio may be casual processing that enables a user of the system to listen to processed audio (with few or minimal audio artifacts) without extensive processing of the audio by the system that recorded the audio. The recorded audio may be subsequently transmitted, via one or more transmission mechanisms, to a different system to perform more extensive processing of the recorded audio.

In some embodiments, the scaling factor or gain factor is stored as metadata in the encoded audio file. As described herein, the scaling factor or the gain factor may be applied to the encoded audio file or the decoded audio file. Additionally, as described herein, the metadata may be accessed either by the system that recorded the audio or by a different post-processing system.

Referring now to FIG. 1, FIG. 1 presents a process flow 100 for adjusting audio properties after recording an audio. At block 110, an audio capturing system as described herein records audio. The recorded audio may be associated with one or more audio levels. At block 120, either the audio capturing system or a separate system determines one or more audio signal properties associated with the recorded audio. At block 130, either the audio capturing system or a separate system compares an audio level associated with the recorded audio with a first predetermined threshold level. At block 140, in response to determining the audio level is greater than the first predetermined threshold level, either the audio capturing system or a separate system adjusts the recorded audio based at least partially on modifying the one or more determined audio signal properties, wherein the adjusting step is performed a finite time interval after the recording step.

Referring now to FIG. 2, FIG. 2 is a diagram illustrating a front view of external components of an exemplary device for recording an audio and/or adjusting the recorded audio. As illustrated in FIG. 2, device 112 may include a housing 305, a microphone 310, a speaker 320, a keypad 330, function keys 340, a display 350, and a camera button 360.

Housing 305 may include a structure configured to contain or at least partially contain components of device 112. For example, housing 305 may be formed from plastic, metal or other natural or synthetic materials or combination(s) of materials and may be configured to support microphone 310, speaker 320, keypad 330, function keys 340, display 350, and camera button 360.

Microphone 310 may include any component capable of transducing air pressure waves to a corresponding electrical signal. For example, a user may speak into microphone 310 during a telephone call. Microphone 310 may be used to receive audio from the user or from the environment surround the device 112. Speaker 320 may include any component capable of transducing an electrical signal to a corresponding sound wave. For example, a user may listen to music through speaker 320.

Keypad 330 may include any component capable of providing input to device 112. Keypad 330 may include a standard telephone keypad. Keypad 330 may also include one or more special purpose keys. In one implementation, each key of keypad 330 may be, for example, a pushbutton. Keypad 330 may also include a touch screen. A user may utilize keypad 330 for entering information, such as text or a phone number, or activating a special function.

Function keys 340 may include any component capable of providing input to device 112. Function keys 340 may include a key that permits a user to cause device 112 to perform one or more operations. The functionality associated with a key of function keys 340 may change depending on the mode of device 112. For example, function keys 340 may perform a variety of operations, such as recording audio, placing a telephone call, playing various media, setting various camera features (e.g., focus, zoom, etc.) or accessing an application. Function keys 340 may include a key that provides a cursor function and a select function. In one implementation, each key of function keys 340 may be, for example, a pushbutton.

Display 350 may include any component capable of providing visual information. For example, in one implementation, display 350 may be a liquid crystal display (LCD). In another implementation, display 350 may be any one of other display technologies, such as a plasma display panel (PDP), a field emission display (FED), a thin film transistor (TFT) display, etc. Display 350 may be utilized to display, for example, text, image, and/or video information. Display 350 may also operate as a view finder, as will be described later. Display 350 may also be used as a user interface to enable a user to configure the process of recording audio and/or adjusting the recorded audio. Camera button 360 may be a pushbutton that enables a user to take an image.

Since device 112 illustrated in FIG. 2 is exemplary in nature, device 112 is intended to be broadly interpreted to include any type of electronic device that includes an image-capturing component. For example, device 112 may include a wireless phone, a personal digital assistant (PDA), a portable computer, a camera, or a wrist watch. In other instances, device 112 may include, for example, security devices or military devices. Accordingly, although FIG. 3 illustrates exemplary external components of device 112, in other implementations, device 112 may contain fewer, different, or additional external components than the external components depicted in FIG. 2. Additionally, or alternatively, one or more external components of device 112 may include the capabilities of one or more other external components of device 112. For example, display 350 may be an input component (e.g., a touch screen). Additionally, or alternatively, the external components may be arranged differently than the external components depicted in FIG. 2.

Referring now to FIG. 3, FIG. 3 is a diagram illustrating a rear view of external components of the exemplary device. As illustrated, in addition to the components previously described, device 112 may include a camera 470, a lens assembly 472, a proximity sensor 476, and a flash 474.

Camera 470 may include any component capable of capturing an image or a stream of images (video). Camera 470 may be a digital camera or a digital video camera. Display 350 may operate as a view finder when a user of device 112 operates camera 470. Camera 470 may provide for automatic and/or manual adjustment of a camera setting. In one implementation, device 112 may include camera software that is displayable on display 350 to allow a user to adjust a camera setting. For example, a user may be able adjust a camera setting by operating function keys 340.

Lens assembly 472 may include any component capable of manipulating light so that an image may be captured. Lens assembly 472 may include a number of optical lens elements. The optical lens elements may be of different shapes (e.g., convex, biconvex, plano-convex, concave, etc.) and different distances of separation. An optical lens element may be made from glass, plastic (e.g., acrylic), or plexiglass. The optical lens may be multicoated (e.g., an antireflection coating or an ultraviolet (UV) coating) to minimize unwanted effects, such as lens flare and inaccurate color. In one implementation, lens assembly 472 may be permanently fixed to camera 470. In other implementations, lens assembly 472 may be interchangeable with other lenses having different optical characteristics. Lens assembly 472 may provide for a variable aperture size (e.g., adjustable f-number).

Proximity sensor 476 (not shown in FIG. 3) may include any component capable of collecting and providing distance information that may be used to enable camera 470 to capture an image properly. For example, proximity sensor 476 may include an infrared (IR) proximity sensor that allows camera 470 to compute the distance to an object, such as a human face, based on, for example, reflected IR strength, modulated IR, or triangulation. In another implementation, proximity sensor 476 may include an acoustic proximity sensor. The acoustic proximity sensor may include a timing circuit to measure echo return of ultrasonic soundwaves. In embodiments that include a proximity sensor 476, the proximity sensor may be used to determine a distance to one or more moving objects, which may or may not be in focus, either prior to, during, or after capturing of an image frame of a scene.

Flash 474 may include any type of light-emitting component to provide illumination when camera 470 captures an image. For example, flash 474 may be a light-emitting diode (LED) flash (e.g., white LED) or a xenon flash. In another implementation, flash 474 may include a flash module.

Although FIG. 3 illustrates exemplary external components, in other implementations, device 112 may include fewer, additional, and/or different components than the exemplary external components depicted in FIG. 3. For example, in other implementations, camera 470 may be a film camera. Additionally, or alternatively, depending on device 112, flash 474 may be a portable flashgun. Additionally, or alternatively, device 112 may be a single-lens reflex camera. In still other implementations, one or more external components of device 112 may be arranged differently.

Referring now to FIG. 4, FIG. 4 is a diagram illustrating internal components of the exemplary system for recording an audio and/or adjusting the recorded audio. As illustrated, device 112 may include microphone 310, speaker 320, keypad 330, function keys 340, display 350, a memory 500, a transceiver 520, and a control unit 530.

Memory 500 may include any type of storing component to store data and instructions related to the operation and use of device 112. For example, memory 500 may include a memory component, such as a random access memory (RAM), a read only memory (ROM), and/or a programmable read only memory (PROM). Additionally, memory 500 may include a storage component, such as a magnetic storage component (e.g., a hard drive) or other type of computer-readable or computer-executable medium. Memory 500 may also include an external storing component, such as a Universal Serial Bus (USB) memory stick, a digital camera memory card, and/or a Subscriber Identity Module (SIM) card.

Memory 500 may include a code component 510 that includes computer-readable or computer-executable instructions to perform one or more functions. These functions include initiating and/or executing the processes illustrated in FIG. 1. However, the functions are not limited to those illustrated in FIG. 1. The code component 510 may work in conjunction with one or more other hardware or software components associated with the device 112 to initiate and/or execute the processes illustrated in FIG. 1 or other processes described herein. Additionally, code component 510 may include computer-readable or computer-executable instructions to provide other functionality other than as described herein.

Transceiver 520 may include any component capable of transmitting and receiving information wirelessly or via a wired connection. For example, transceiver 520 may include a radio circuit that provides wireless communication with a network or another device.

Control unit 530 may include any logic that may interpret and execute instructions, and may control the overall operation of device 112. Logic, as used herein, may include hardware, software, and/or a combination of hardware and software. Control unit 530 may include, for example, a general-purpose processor, a microprocessor, a data processor, a co-processor, and/or a network processor. Control unit 530 may access instructions from memory 500, from other components of device 112, and/or from a source external to device 112 (e.g., a network or another device).

Control unit 530 may provide for different operational modes associated with device 112. For example, a first mode is an audio and/or video recording mode, and a second mode is an audio adjusting mode. Additionally, control unit 530 may operate in multiple modes simultaneously. For example, control unit 530 may operate in a camera mode, a walkman mode, and/or a telephone mode. For example, when in camera mode, logic may enable device 112 to capture video and/or audio.

Although FIG. 4 illustrates exemplary internal components, in other implementations, device 112 may include fewer, additional, and/or different components than the exemplary internal components depicted in FIG. 4. For example, in one implementation, device 112 may not include transceiver 520. In still other implementations, one or more internal components of device 112 may include the capabilities of one or more other components of device 112. For example, transceiver 520 and/or control unit 530 may include their own on-board memory.

In accordance with embodiments of the invention, the term "module" with respect to a system (or a device) may refer to a hardware component of the system, a software component of the system, or a component of the system that includes both hardware and software. As used herein, a module may include one or more modules, where each module may reside in separate pieces of hardware or software.

As used herein, the term "automatic" refers to a function, a process, a method, or any part thereof, which is executed by computer software upon occurrence of an event or a condition without intervention by a user.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa. In addition, where possible, any terms expressed in the singular form herein are meant to also include the plural form and/or vice versa, unless explicitly stated otherwise. As used herein, "at least one" shall mean "one or more" and these phrases are intended to be interchangeable. Accordingly, the terms "a" and/or "an" shall mean "at least one" or "one or more," even though the phrase "one or more" or "at least one" is also used herein. Like numbers refer to like elements throughout.

As will be appreciated by one of ordinary skill in the art in view of this disclosure, the present invention may include and/or be embodied as an apparatus (including, for example, a system, machine, device, computer program product, and/or the like), as a method (including, for example, a business method, computer-implemented process, and/or the like), or as any combination of the foregoing. Accordingly, embodiments of the present invention may take the form of an entirely business method embodiment, an entirely software embodiment (including firmware, resident software, micro-code, stored procedures in a database, etc.), an entirely hardware embodiment, or an embodiment combining business method, software, and hardware aspects that may generally be referred to herein as a "system." Furthermore, embodiments of the present invention may take the form of a computer program product that includes a computer-readable storage medium having one or more computer-executable program code portions stored therein. As used herein, a processor, which may include one or more processors, may be "configured to" perform a certain function in a variety of ways, including, for example, by having one or more general-purpose circuits perform the function by executing one or more computer-executable program code portions embodied in a computer-readable medium, and/or by having one or more application-specific circuits perform the function.

It will be understood that any suitable computer-readable medium may be utilized. The computer-readable medium may include, but is not limited to, a non-transitory computer-readable medium, such as a tangible electronic, magnetic, optical, electromagnetic, infrared, and/or semiconductor system, device, and/or other apparatus. For example, in some embodiments, the non-transitory computer-readable medium includes a tangible medium such as a portable computer diskette, a hard disk, a random access memory (RAM), a read-only memory (ROM), an erasable programmable read-only memory (EPROM or Flash memory), a compact disc read-only memory (CD-ROM), and/or some other tangible optical and/or magnetic storage device. In other embodiments of the present invention, however, the computer-readable medium may be transitory, such as, for example, a propagation signal including computer-executable program code portions embodied therein.

One or more computer-executable program code portions for carrying out operations of the present invention may include object-oriented, scripted, and/or unscripted programming languages, such as, for example, Java, Perl, Smalltalk, C++, SAS, SQL, Python, Objective C, JavaScript, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F#.

Some embodiments of the present invention are described herein with reference to flowchart illustrations and/or block diagrams of apparatus and/or methods. It will be understood that each block included in the flowchart illustrations and/or block diagrams, and/or combinations of blocks included in the flowchart illustrations and/or block diagrams, may be implemented by one or more computer-executable program code portions. These one or more computer-executable program code portions may be provided to a processor of a general purpose computer, special purpose computer, and/or some other programmable data processing apparatus in order to produce a particular machine, such that the one or more computer-executable program code portions, which execute via the processor of the computer and/or other programmable data processing apparatus, create mechanisms for implementing the steps and/or functions represented by the flowchart(s) and/or block diagram block(s).

The one or more computer-executable program code portions may be stored in a transitory and/or non-transitory computer-readable medium (e.g., a memory, etc.) that can direct, instruct, and/or cause a computer and/or other programmable data processing apparatus to function in a particular manner, such that the computer-executable program code portions stored in the computer-readable medium produce an article of manufacture including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with, and/or replaced with, operator- and/or human-implemented steps in order to carry out an embodiment of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations, modifications, and combinations of the just described embodiments can be configured without departing from the scope and spirit of the invention. Therefore, it is to be understood that, within the scope of the appended claims, the invention may be practiced other than as specifically described herein.

What is claimed is:

1. A method for adjusting audio, the method comprising:
   recording, by a computing device processor, audio to an audio file using an audio capturing system, wherein the recorded audio is associated with an audio level;
   determining, by a computing device processor simultaneous with the recording of the audio, at least one audio signal property associated with the recorded audio;
   comparing, by a computing device processor, the audio level with a first predetermined threshold level; and
   in response to determining the audio level is greater than the first predetermined threshold level, adjusting, by a computing device processor, the recorded audio based at least partially on modifying the at least one determined audio signal property, wherein the adjusting step is performed a finite time interval following the recording step while further audio is being recorded to the audio file, such that the adjusted audio overwrites unadjusted audio in the audio file prior to completion of the audio file.

2. The method of claim 1, wherein the adjusting step comprises applying a gain factor or a scaling factor to the recorded audio such that that the audio level associated with the recorded audio is reduced.

3. The method of claim 1, further comprising encoding, by a computing device processor, the recorded audio.

4. The method of claim 3, wherein the adjusting step comprises adjusting the encoded audio based at least partially on applying a scaling factor to the encoded audio.

5. The method of claim 4, wherein the scaling factor is stored as metadata in a file that comprises the encoded audio.

6. The method of claim 3, further comprising:
   decoding, by a computing device processor, the encoded audio; and
   wherein the adjusting step comprises adjusting the decoded audio based at least partially on applying a gain factor to the decoded audio.

7. The method of claim 1, wherein the adjusting step is performed either by the audio recording system or by a separate computing system.

8. The method of claim 1, further comprising:
   Accessing, by a computing device processor, a database comprising at least one set of audio signal properties;
   selecting, by a computing device processor, from the database, a set of audio signal properties;
   determining, by a computing device processor, either a gain factor or a scaling factor based at least partially on the selected set of audio signal properties; and
   adjusting, by a computing device processor, the recorded audio based at least partially on the determined gain factor or scaling factor.

9. The method of claim 1, further comprising:
   comparing, by a computing device processor, the audio level with a second predetermined threshold level; and
   in response to determining the audio level is smaller than the second predetermined threshold level, adjusting, by a computing device processor, the recorded audio based at least partially on modifying the at least one determined audio signal property, wherein the adjusting step comprises applying a gain factor or a scaling factor to the recorded audio such that that the audio level associated with the recorded audio is increased.

10. The method of claim 1, wherein the signal properties comprise at least one of a root mean square level, a peak level, an average level, and a peak-to-peak level.

11. The method of claim 1, wherein the adjusting step reduces a dynamic range associated with the recorded audio.

12. The method of claim 1, wherein the adjusting step reduces audible artifacts in the recorded audio.

13. The method of claim 1, further comprising:
   comparing, by a computing device processor, the audio level with a third predetermined threshold level; and in response to determining the audio level is smaller than the third predetermined threshold level, adjusting, by a computing device processor, the recorded audio based at least partially on modifying the at least one determined audio signal property, wherein the adjusting step comprises applying a gain factor or a scaling factor to the recorded audio such that that the audio level associated with the recorded audio is decreased.

14. The method of claim 1, wherein the adjusting step comprises applying at least one gain factor or scaling factor to the recorded audio such that a separate gain factor or scaling factor is applied either to each sub-period of the recorded audio or to audio associated with each audio source in the recorded audio.

15. A system for adjusting audio, the system comprising: an audio capturing system configured to:
   record, by a computing device processor, audio to an audio file, wherein the recorded audio is associated with an audio level;
   determine, by a computing device processor simultaneous with the recording of the audio, at least one audio signal property associated with the recorded audio;
   compare, by a computing device processor, the audio level with a first predetermined threshold level; and
   in response to determining the audio level is greater than a first predetermined threshold level, adjust, by a computing device processor, the recorded audio based at least partially on modifying the at least one determined audio signal property, wherein the adjusting step is performed at a finite time interval following the recording step while further audio is being recorded to the audio file, such that the adjusted audio overwrites unadjusted audio in the audio file prior to completion of the audio file.

16. A computer program product for adjusting audio, the computer program product comprising:
   a non-transitory computer readable medium comprising code configured to cause a computer to:
      record audio to an audio file, wherein the recorded audio is associated with an audio level;
      determine, simultaneous with the recording of the audio, at least one audio signal property associated with the recorded audio;
      compare the audio level with a first predetermined threshold level; and
      in response to determining the audio level is greater than a first predetermined threshold level, adjust the recorded audio based at least partially on modifying the at least one determined audio signal property, wherein the adjusting step is performed at a finite time interval following the recording step while further audio is being recorded to the audio file, such that the adjusted audio overwrites unadjusted audio in the audio file prior to completion of the audio file.

* * * * *

UNITED STATES PATENT AND TRADEMARK OFFICE
CERTIFICATE OF CORRECTION

PATENT NO. : 9,692,382 B2
APPLICATION NO. : 14/359611
DATED : June 27, 2017
INVENTOR(S) : Peter Isberg et al.

Page 1 of 1

It is certified that error appears in the above-identified patent and that said Letters Patent is hereby corrected as shown below:

On the Title Page

After "(73) Assignee: Sony Corporation, Tokyo (JP)" please add "Sony Mobile Communications Inc., Tokyo (JP)"

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*